(12) United States Patent
Hwang et al.

(10) Patent No.: US 7,695,896 B2
(45) Date of Patent: Apr. 13, 2010

(54) METHOD FOR FORMING PHOTORESIST PATTERN

(75) Inventors: Kyu Youn Hwang, Incheon (KR); Chin Sung Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 489 days.

(21) Appl. No.: 11/552,335

(22) Filed: Oct. 24, 2006

(65) Prior Publication Data
US 2007/0105057 A1   May 10, 2007

(30) Foreign Application Priority Data
Oct. 24, 2005   (KR) ...................... 10-2005-0100326

(51) Int. Cl.
*G03F 7/26* (2006.01)
(52) U.S. Cl. ....................................... 430/311; 430/330
(58) Field of Classification Search ................. 430/311, 430/322, 330
See application file for complete search history.

(56) References Cited

U.S. PATENT DOCUMENTS

| 3,853,648 | A | * | 12/1974 | Janus et al. | .................... | 216/55 |
| 4,502,916 | A | * | 3/1985 | Umezaki et al. | .............. | 216/47 |
| 2002/0164545 | A1 | * | 11/2002 | Sakaguchi et al. | .......... | 430/314 |

* cited by examiner

*Primary Examiner*—Kathleen Duda
(74) *Attorney, Agent, or Firm*—Cantor Colburn LLP

(57) ABSTRACT

A method of forming a photoresist pattern, capable of improving an adhesion property of the photoresist pattern formed on a substrate, includes forming a photocatalytic layer on a substrate, forming a negative-type photoresist layer on the photocatalytic layer, exposing the photoresist layer to ultraviolet rays, heat-treating the photoresist layer, and developing the photoresist layer to form the photoresist pattern. Thereby, applying the photocatalytic layer formed on various substrates, the photoresist pattern has excellent adhesion property and is capable of ensuring a high aspect ratio.

14 Claims, 5 Drawing Sheets

METHOD FOR FORMING PHOTORESIST PATTERN

This application claims priority to Korean Patent Application No. 10-2005-0100326, filed Oct. 24, 2005, and all the benefits accruing therefrom under 35 U.S.C. §119, the contents of which in its entirety are herein incorporated by reference.

BACKGROUND OF THE INVENTION (a) Field of the Invention

The present invention relates generally to a method for forming a photoresist pattern, and more particularly, to a method for forming a photoresist pattern capable of improving adhesion strength of the photoresist pattern formed on a substrate.

(b) Description of the Prior Art

Recently, the field of pathology and/or biotechnology related to disease diagnosis or efficacy evaluation of chemotherapy, respectively, has been increasingly studied as future technology. A biochip has been employed as one of the methods of accelerating these studies. Applications considered as a biochip include a cell binding chip or an electrolysis chip.

In the cell binding chip, it is useful to increase a surface area of a microstructure to which a cell is bound in order to increase cell binding efficiency. The electrolysis chip is used to extract deoxyribo nucleic acid ("DNA") in a cell bound to the microstructure.

If an SU-8 photoresist, commercially available from Microchem Company, is applied as a negative-type photoresist in order to form a microstructure, the microstructure can be formed by a single process of forming a photoresist pattern without additional processes, and thus the SU-8 photoresist is widely used to form various microstructures.

The biochip sometimes requires microstructures having a high aspect ratio on various substrates. For example, a photoresist pattern formed on a silicon substrate using the SU-8 photoresist has an excellent adhesion property on the silicon substrate, and thus it is possible to form the SU-8 microstructures having a high aspect ratio of 10 or more.

However, it is often difficult to steadily maintain the adhesion properties between the microstructure and substrate when various substrates are used. Hence, it is essential to ensure excellent adhesion strength in various substrates in order to form a stable microstructure having a high aspect ratio.

In particular, it is necessary to improve the adhesion property of the microstructure formed on a substrate of glass, metal and metal oxide on which the adhesion strength is found to be weak.

A method of improving the adhesion strength of the photoresist pattern formed on various substrates is disclosed in U.S. Pat. No. 6,741,819 and U.S. Patent Application Publication No. 2004/0214098. The U.S. patent and published patent application show methods including coating a polyimide layer as an adhesion layer before a photoresist layer is formed on a substrate or adding a material to the photoresist solution for improving adhesion strength.

In the case of coating a polyimide layer in order to improve the adhesion property of SU-8 photoresist, the organic polyimide layer can have an influence on the photoresist pattern, or is sometimes not suitable to be used for the existing microstructure. In the case of adding a material to the photoresist solution to improve the adhesion property in the SU-8 photoresist, it is difficult to produce a suitable SU-8 photoresist solution, and thus is not substantially suitable for direct use.

Further, adhesion layers such as a self-assembled monolayer ("SAM"), hexamethyldisilazane ("HMDS") and Omni-Coat (commercially available from Microchem Company) can be applied to improve the adhesion strength of the SU-8 microstructures on the glass substrate.

In spite of forming the photoresist pattern on the glass substrate using these methods, the generated SU-8 microstructures separate from the glass substrate due to insufficient adhesion strength.

FIG. 1 is a top plan view photograph showing the SU-8 microstructures formed on a silicon substrate according to the prior art. FIG. 2 is a photograph showing the SU-8 microstructures formed by a conventional method for forming the SU-8 microstructures on a glass substrate, in which the SU-8 microstructures are stripped off in part.

It can be found from the photograph of FIG. 1 that the SU-8 microstructures formed on the silicon substrate maintain a clear pattern due to excellent adhesion properties. In contrast, in FIG. 2, the SU-8 microstructures formed on the glass substrate are stripped off from the glass substrate due to insufficient adhesion strength, and thus fail to maintain a clear pattern. Further, the same result of the SU-8 microstructures being stripped off without improving adhesion strength was obtained, in spite of applying the above-described method for improving adhesion strength.

Therefore, as these results indicate, it is essential to form the photoresist layer having excellent adhesion on various substrates in order to allow the microstructures formed from the photoresist layer to be effectively used.

BRIEF SUMMARY OF THE INVENTION

Accordingly, the present invention has been made to solve these various problems occurring in the prior art, and an aspect, feature and advantage of the present invention include providing a method of forming a photoresist layer which has excellent adhesion properties on various substrates and is thus capable of generating microstructures having a high aspect ratio. In order to accomplish this aspect, feature and advantage, there is provided a method of forming a photoresist pattern. The method is capable of improving adhesion property of the photoresist pattern formed on a substrate. The method includes forming a photocatalytic layer on a substrate, forming a negative-type photoresist layer on the photocatalytic layer, exposing the photoresist layer to ultraviolet rays, heat-treating the photoresist layer, and developing the photoresist layer which forms the photoresist pattern.

Here, the substrate may be formed of any one selected from the group consisting of silicon, glass, metal, metal oxide, ceramic and plastic.

Further, the substrate may be deposited by a thin layer formed of any one selected from the group consisting of silicon, glass, metal, metal oxide, ceramic and plastic.

Further, the photocatalytic layer may be formed of any one selected from the group consisting of titanium dioxide ("$TiO_2$"), zinc oxide ("ZnO"), tin dioxide ("$SnO_2$"), strontium titannate ("$SrTiO_3$"), tungsten oxide ("$WO_3$"), boron oxide ("$B_2O_3$"), and iron oxide ("$FeO_3$"). Further, the photocatalytic layer may be formed on the substrate using any one selected from a sol-gel method, a chemical vapor deposition and a physical vapor deposition.

In addition, the substrate may further include a metal pattern, and in the exposing the photoresist layer, the ultraviolet rays may be illuminated on a bottom side of the substrate.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE INVENTION

Figure 1:
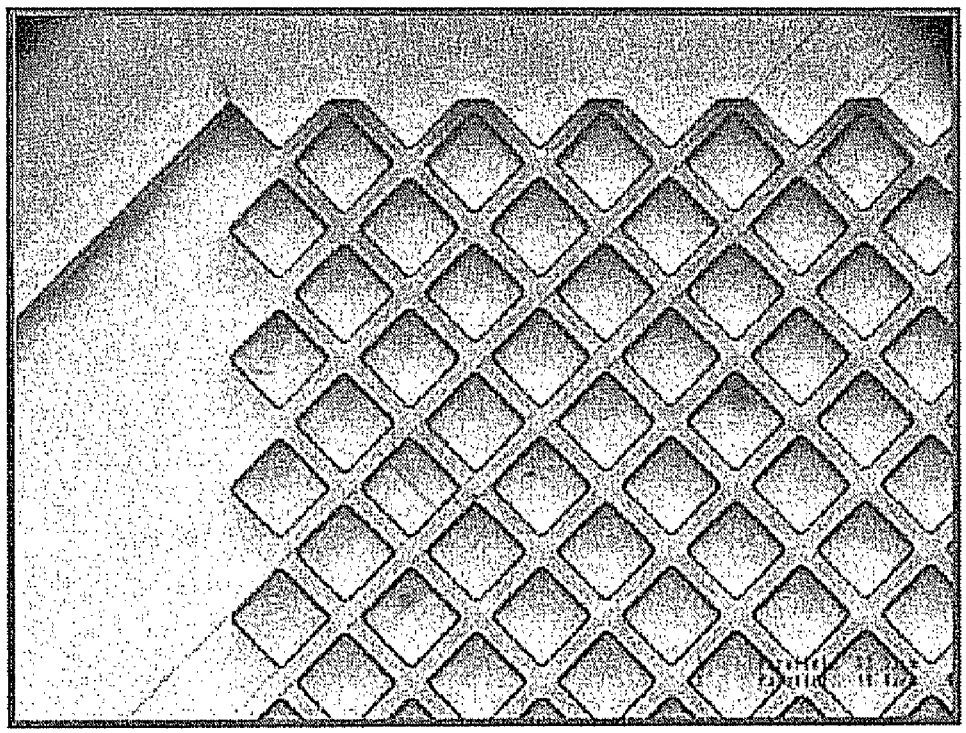
FIG. 1 is a top plan view photograph showing the SU-8 microstructures formed on a silicon substrate according to the prior art.
Figure 2:
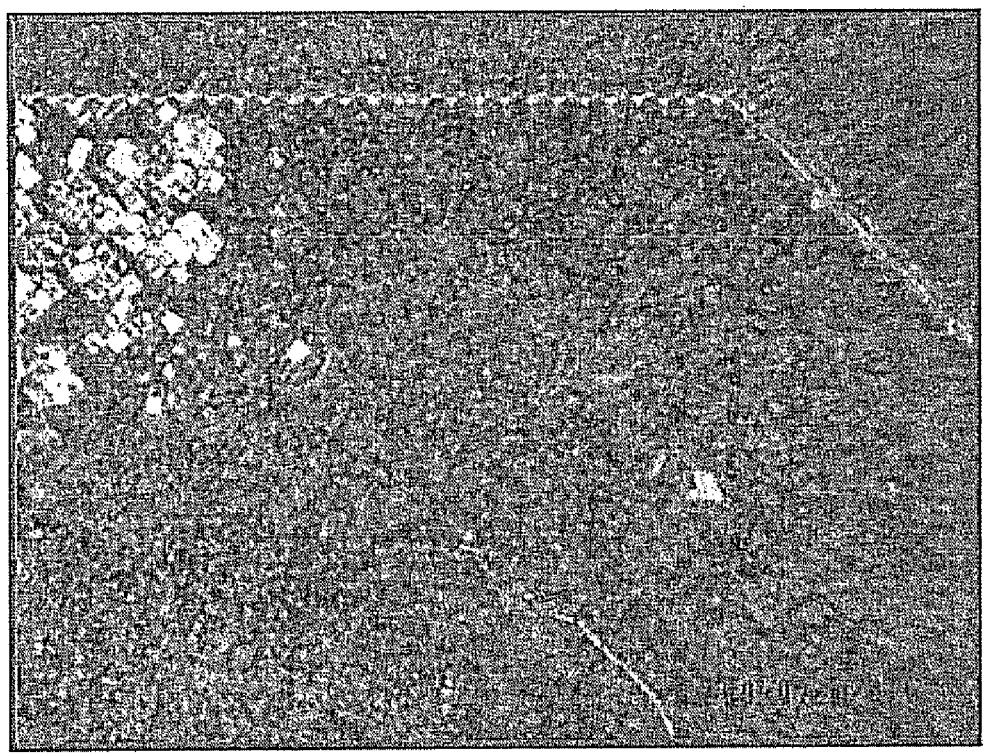
FIG. 2 is a photograph showing the SU-8 microstructures formed by a conventional method for forming the photoresist pattern on a glass substrate, in which the SU-8 microstructures are stripped off in part.

The present invention now will be described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in more detail with reference to the accompanying drawings.

Figure 3:
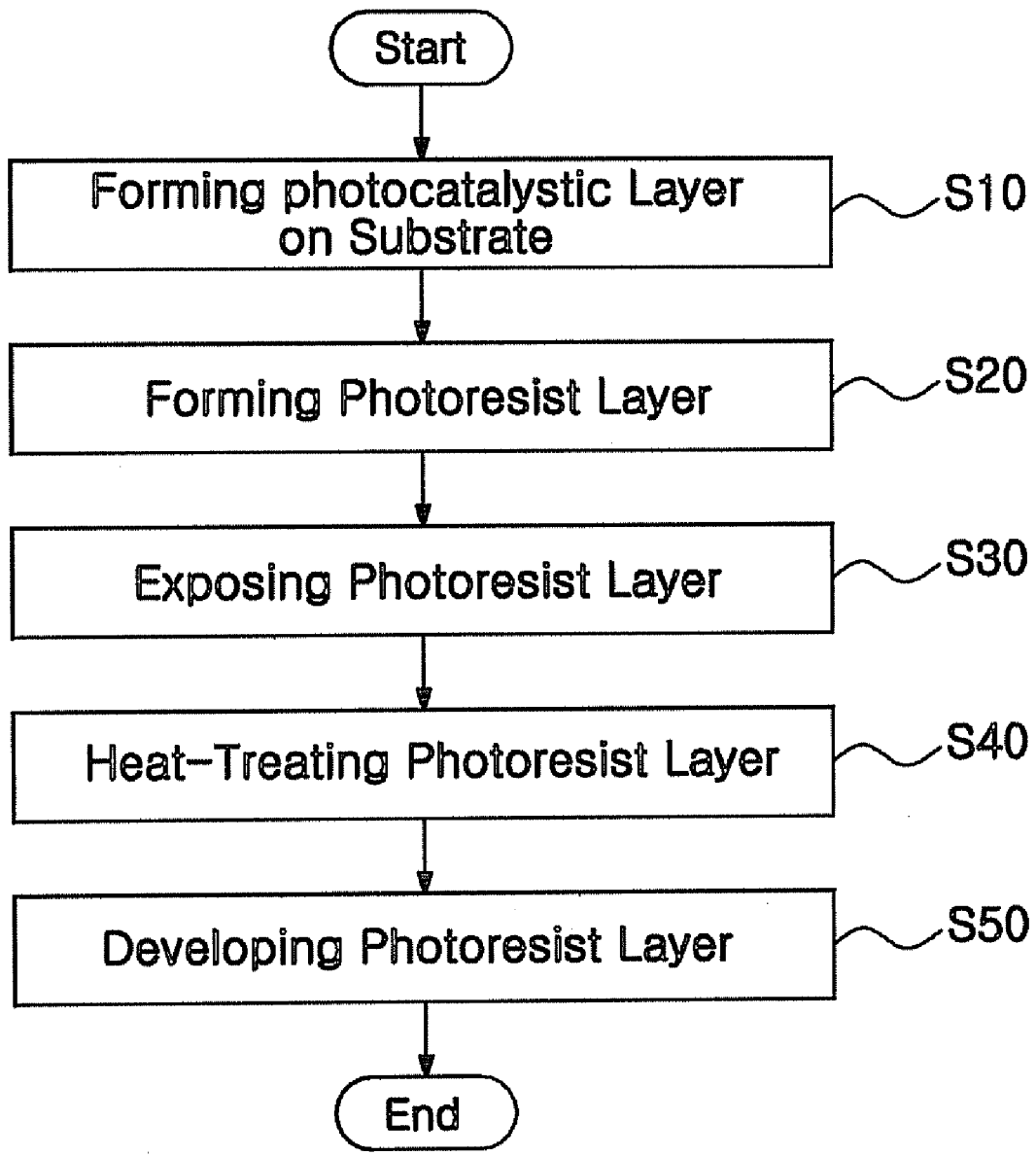
FIG. 3 is a flow chart illustrating an exemplary embodiment of a method for forming a photoresist pattern in accordance with the present invention.

FIG. 3 is a flow chart illustrating an exemplary embodiment of a method for forming a photoresist pattern in accordance with the present invention.

As illustrated in FIG. 3, first, a photocatalytic layer is formed on a substrate according to the exemplary method for forming a photoresist pattern of the present invention (S10).

The substrate is formed of any one selected from the group consisting of silicon, glass, metal, metal oxide, ceramic and plastic. The substrate is deposited by a thin layer formed of any one selected from the group consisting of silicon, glass, metal, metal oxide, ceramic and plastic according to use. The thin layer or its pattern formed on the substrate are dependent on the use, for instance, of a cell binding chip, an electrolysis chip, and so on.

The photocatalytic layer is formed of any one selected from the group consisting of titanium dioxide ("$TiO_2$"), zinc oxide ("ZnO"), tin dioxide ("$SnO_2$"), strontium titannate ("$SrTiO_3$"), tungsten oxide ("$WO_3$"), boron oxide ("$B_2O_3$"), and iron oxide ("$FeO_3$"). The photocatalytic layer is preferably formed on the substrate using any one selected from a sol-gel method, a chemical vapor deposition method and a physical vapor deposition method.

For example, when a titanium dioxide layer as the photocatalytic layer is formed on a glass substrate using the sol-gel method, the glass substrate is cleaned, and a titanium dioxide sol solution is prepared.

To prepare the titanium dioxide sol solution, titanium isopropoxide ("$Ti(OCH_3)_4$"), isopropanol ("$(CH_3)_2CHOH$"), and hydrochloric acid ("HCl") are mixed and stabilized after agitation for a long time. Here, for example, $Ti(OCH_3)_4$, $(CH_3)_2CHOH$ and HCl are mixed at a volume ratio of 7.5:106.25:1, and the HCl which is used has a concentration of 0.1 mole.

The titanium dioxide sol solution prepared in this way is applied to the glass substrate by means of a spin coating method, and is then heat-treated and calcinated at a temperature of 500° C., thereby forming a titanium dioxide layer on the glass substrate.

The chemical vapor deposition or the physical vapor deposition is carried out using the corresponding deposition equipment. At this time, the photocatalytic layer is preferably deposited at a thickness of hundreds of angstroms or less.

Next, a photoresist is applied on a top surface of the substrate on which the photocatalytic layer is formed, thus forming a photoresist layer (S20). The photoresist is a negative-type photoresist, for example the SU-8 photoresist, which is commercially available from Microchem Company and contains an epoxy component having an excellent adhesion property and chemical resistance. The use of this negative-type photoresist is preferable to form a microstructure suitable for the use of a DNA-related biochip, a cell binding chip, or an electrolysis chip, for example.

The deposited thickness of the photoresist layer may be varied within a range from about several microns to about hundreds of microns by adjusting a viscosity of the photoresist and the revolutions per minute ("rpms") of the substrate.

Subsequently, in order to remove solvent contained in the photoresist layer, a soft bake heat-treating the substrate is carried out. At this time, the soft bake is carried out within a range from about 65° C. to about 95° C., according to a thickness of the photoresist layer applied to the substrate.

Next, the photoresist layer formed on the substrate is exposed to ultraviolet rays, for instance, using a mask having a microstructure pattern (S30). Then, a post exposure bake ("PEB") process heat-treating the exposed photoresist layer at high temperature is carried out (S40).

Figure 4:
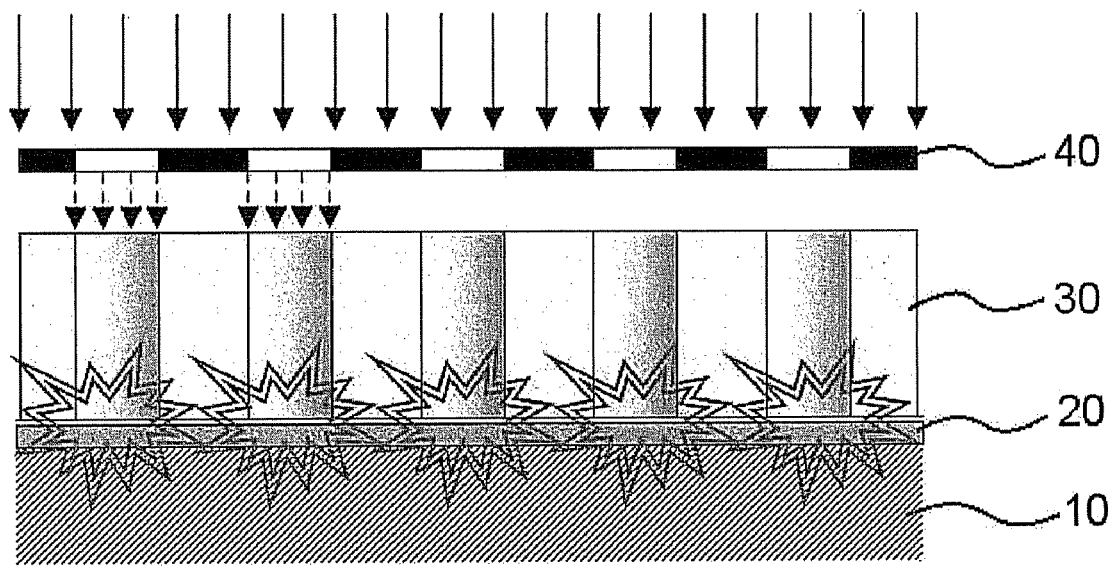
FIG. 4 is a cross-sectional view for explaining the reaction of a photocatalytic layer formed on a substrate when a photoresist layer is exposed to ultraviolet rays passed through a mask.

FIG. 4 is a cross-sectional view for explaining the reaction of a photocatalytic layer 20 formed on a substrate 10 when a photoresist layer 30 is exposed to ultraviolet rays.

When the ultraviolet rays pass through a mask 40 and travel through the photoresist layer 30 to reach the photocatalytic layer 20, the photocatalytic layer 20 reacts with the ultraviolet rays to produce a hydroxyl radical ("OH*") or superoxide ("$O_2^-$") between the photoresist layer 30 and the photocatalytic layer 20.

As a result, organic components of the photoresist are decomposed at an interface between the photoresist layer 30 and the photocatalytic layer 20, thereby inducing cross-linking at the interface to improve adhesion therebetween.

In particular, when the photocatalytic layer 20 is formed by the sol-gel method, the photocatalytic layer 20 has a porous surface in the forming process, and thus an area contacting the photoresist layer 30 is increased. Hence, the adhesion strength between the photoresist layer 30 and the photocatalytic layer 20 is additionally improved, which is regarded as being more preferable.

Further, the PEB process serves to facilitate a cross-linking reaction so that the photoresist layer 30 exposed by the ultraviolet rays passed through the mask 40 does not react with a developing solution, thereby improving resolution of the photoresist pattern.

More specifically, the PEB process performed on SU-8 photoresist carries out primary low-temperature heat treatment at a temperature of 65° C. or less, for example, of gradually increasing from the temperature of 65° C. or less, and then secondary high-temperature heat treatment in order to minimize stress, wafer flexure, and cracking of the photoresist layer 30, which occurs during the heat treatment.

The PEB process is carried out by heating the exposed photoresist layer 30 at a secondary high-temperature heat treatment temperature, for example, between about 85° C. and about 95° C. for about 5 minutes or more.

Subsequently, the photoresist layer 30 is developed with a developing solution, and thus portions of the photoresist layer 30, which are not exposed to the ultraviolet rays, are removed to form a photoresist pattern (S50) (FIG. 3).

At this time, the developing solution is a dedicated SU-8 developing solution corresponding with the SU-8 photoresist. The photoresist layer completing the development is heat-treated at a high temperature of 150° C., thereby removing remaining solvents while preventing a change of the photoresist pattern, and then curing a structure of the photoresist pattern to complete cross-linking. The high-temperature heat treatment has an advantage in that it increases the adhesion between the substrate and the photoresist pattern.

Now, a method for forming a photoresist pattern capable of being applied to the case of forming the photoresist pattern on a substrate having metal electrodes will now be described as another exemplary embodiment of the present invention.

In this case, first, a metal pattern is formed on a transparent substrate such as a glass or plastic substrate by means of ordinary photoresist and etching processes using a mask having an electrode shape.

Then, a photocatalytic layer is formed on the substrate having the metal pattern. The following processes are the same as in the previous exemplary embodiment of the present invention.

However, when a photoresist layer is exposed, ultraviolet rays are preferably illuminated on a bottom side of the substrate.

When the photoresist pattern is formed using the metal pattern formed on the substrate instead of the mask, self-alignment results thereby increasing a process margin, and productivity is improved because the mask is not separately used.

Further, the photocatalytic layer has a thickness of hundreds of angstroms or less such that the ultraviolet rays illuminated on the bottom side of the transparent substrate can be effectively transmitted.

Figure 5:
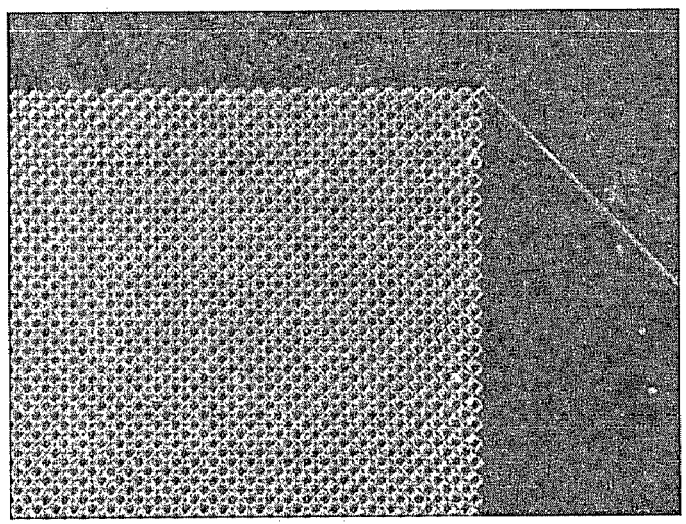
FIGS. 5 and 6 are top plan view photographs showing a result of the SU-8 microstructures formed on a glass substrate using an exemplary embodiment of a photoresist pattern forming method in accordance with the present invention.
Figure 6:
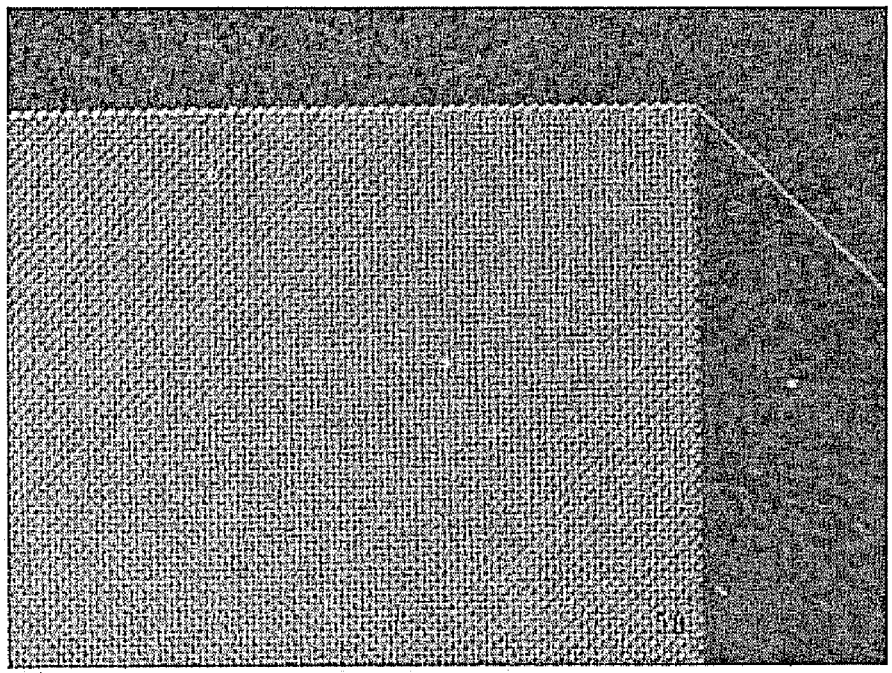
Figure 7:
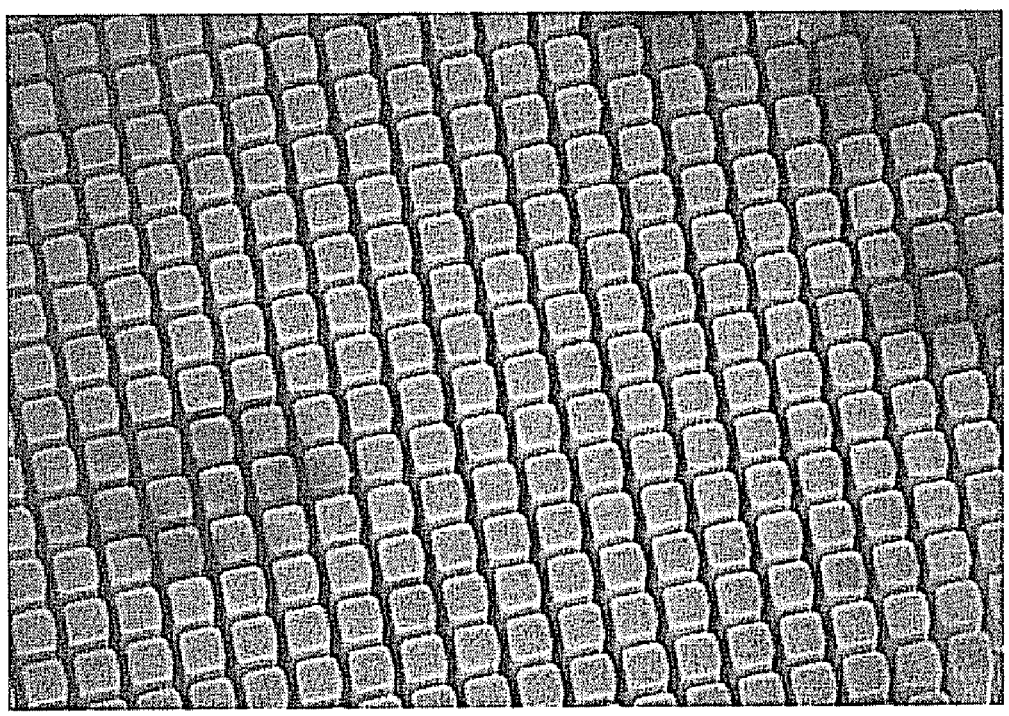
FIG. 7 is an enlarged photograph of FIG. 5.

FIGS. 5 and 6 are top plan view photographs showing a result of SU-8 microstructures formed on a glass substrate applying a titanium dioxide layer formed by a sol-gel method in an exemplary embodiment of a photoresist pattern forming method in accordance with the present invention FIG. 7 is an enlarged photograph of FIG. 5.

The manufactured pillars in FIGS. 5 and 6 have sizes of 50 μm×50 μm×100 μm and 25 μm×25 μm×100 μm, respectively. Here, distances between adjacent pillars are 17 μm and 12.5 μm, respectively.

It can be seen from the photographs that a clear photoresist pattern is formed without defects occurring due to insufficient adhesion strength. The SU-8 microstructures having a high aspect ratio was formed by the exemplary photoresist pattern forming method of the present invention without defects.

In order to evaluate adhesion strength of the SU-8 microstructures formed by the exemplary photoresist pattern forming method of the present invention, shear stress of the SU-8 microstructures on the various substrates is measured.

Figure 8:
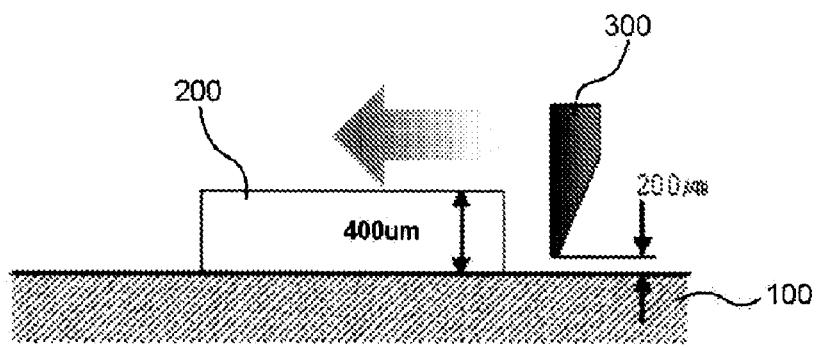
FIG. 8 is a cross-sectional schematic view illustrating a microstructure on a substrate for evaluating shear stress.

FIG. 8 is a cross-sectional schematic view illustrating a microstructure on a substrate for evaluating shear stress.

The SU-8 microstructures 200 in FIG. 8 were formed on a glass substrate, a silicon substrate and a glass substrate having a titanium dioxide layer, and were compared.

The SU-8 microstructure 200 formed on each substrate 100 with SU-8 photoresist had a size of 300 μm×300 μm×400 μm, as illustrated in FIG. 8.

In order to measure the shear stress, a measurement tool 300 was pressed onto the SU-8 microstructure 200. Then, when the SU-8 microstructure 200 was separated from the substrate 100, the force applied to the measurement tool 300 was measured.

Figure 9:
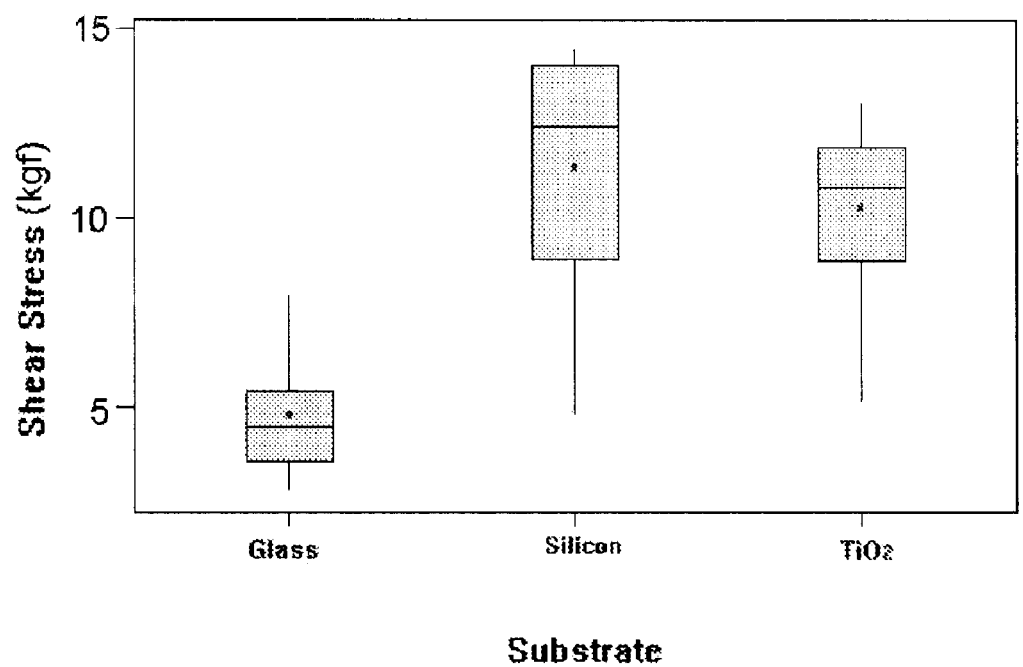
FIG. 9 is a comparative graph showing results measuring shear stress with respect to SU-8 microstructures formed on a glass substrate, a silicon substrate, and a titanium dioxide layer on a glass substrate.

FIG. 9 is a comparative graph showing results of measuring shear stress using the method of FIG. 8 with respect to the SU-8 microstructures formed on a glass substrate, a silicon substrate and a glass substrate having a titanium dioxide layer. A unit of measured shear stress is kilogram-force ("kgf").

As can be seen from the results of FIG. 9, the shear stress of the SU-8 microstructures 200 formed on the glass substrate 100 having a photocatalytic layer of titan dioxide was equivalent to that of the SU-8 microstructures formed on the silicon substrate within a tolerance.

In contrast, the shear stress of the SU-8 microstructures formed on the glass substrate was remarkably reduced to an amount of 46% or less, compared to those of the SU-8 microstructures formed on the silicon substrate or the glass substrate having a photocatalytic layer.

Consequently, in the case where the adhesion strength of the SU-8 microstructure as in the glass substrate is remarkably low, the photocatalytic layer may be applied using the exemplary photoresist pattern forming method of the present invention and the SU-8 microstructures having the adhesion strength equivalent to that of the SU-8 microstructures formed on the silicon substrate can be formed.

As described above, applying the photocatalytic layer formed on various substrates by means of the exemplary photoresist pattern forming method of the present invention, a photoresist pattern having excellent adhesion strength and capable of ensuring a high aspect ratio can be obtained.

Although exemplary embodiments of the present invention have been described for illustrative purposes, those skilled in the art will appreciate that various modifications, alterations, additions and substitutions are possible, without departing from the scope and spirit of the present invention as disclosed in the accompanying claims.

What is claimed is:

1. A method of forming a photoresist pattern, the method comprising:
    forming a photocatalytic layer on a substrate;
    forming a negative-type photoresist layer on the photocatalytic layer;
    exposing the photoresist layer to ultraviolet rays, wherein the photocatalytic layer reacts with the ultraviolet rays passed through the photoresist layer to produce a hydroxyl radical or superoxide between the photoresist layer and the photocatalytic layer, thereby inducing cross-linking at an interface between the photoresist layer and the photocatalytic layer;
    heat-treating the photoresist layer; and
    developing the photoresist layer which forms the photoresist pattern.

2. The method as claimed in claim 1, wherein the substrate is one selected from the group consisting of a silicon substrate, a glass substrate, a metal oxide substrate, a ceramic substrate and a plastic substrate.

3. The method as claimed in claim 1, further comprising forming a thin layer on the substrate, wherein the thin layer is one selected from the group consisting of a silicon layer, a glass layer, a metal layer, a metal oxide layer, a ceramic layer and a plastic layer, and the photocatalytic layer is formed on the thin layer.

4. The method as claimed in claim 1, wherein the photocatalytic layer is one selected from the group consisting of a titanium dioxide ($TiO_2$) layer, a zinc oxide (ZnO) layer, a tin dioxide ($SnO_2$) layer, a strontium titanate ($SrTiO_3$) layer, tungsten oxide ($WO_3$) layer, a boron oxide ($B_2O_3$) layer and an iron oxide ($FeO_3$) layer.

5. The method as claimed in claim 4, wherein the photocatalytic layer is formed on the substrate using one method selected from the group consisting of sol-gel method, a chemical vapor deposition method and a physical vapor deposition method.

6. The method as claimed in claim 1, wherein the photocatalytic layer is formed on the substrate using one method selected from the group consisting of a sol-gel method, a chemical vapor deposition method and a physical vapor deposition method.

7. A method of forming a photoresist pattern, the method comprising:
    forming a photocatalytic layer on a substrate, wherein the photocatalytic layer has a porous surface;
    forming a negative-type photoresist layer on the porous surface of the photocatalytic layer;
    exposing the photoresist layer to ultraviolet rays, wherein the photocatalytic layer reacts with the ultraviolet rays passed through the photoresist layer to produce a hydroxyl radical or superoxide between the photoresist layer and the photocatalytic layer, thereby including cross-linking at an interface between the photoresist layer and the photocatalytic layer;
    heat-treating the photoresist layer; and
    developing the photoresist layer which forms the photoresist pattern.

8. The method as claimed in claim 7, wherein the photocatalytic layer is formed by a sol-gel method.

9. The method as claimed in claim 7, wherein the substrate is one selected from the group consisting of a silicon substrate, a glass substrate, a metal oxide substrate, a ceramic substrate and a plastic substrate.

10. The method as claimed in claim 7, wherein the photocatalytic layer is one selected from the group consisting of a titanium dioxide ($TiO_2$) layer, a zinc oxide (ZnO) layer, a tin dioxide ($SnO_2$) layer, a strontium titanate ($SrTiO_3$) layer, a tungsten oxide ($WO_3$) layer, a boron oxide ($B_2O_3$) layer, and an iron oxide ($FeO_3$) layer.

11. A method of forming a photoresist pattern, the method comprising:
    forming a photocatalytic layer on a substrate;
    forming a negative-type photoresist layer on the photocatalytic layer, wherein the photoresist layer comprises an epoxy component;
    exposing the photoresist layer to ultraviolet rays, wherein the photocatalytic layer reacts with the ultraviolet rays passed through the photoresist layer to produce a hydroxyl radical or superoxide between the photoresist layer and the photocatalytic layer, thereby inducing cross-linking at an interface between the photoresist layer and the photocatalytic layer;
heat-treating the photoresist layer; and
developing the photoresist layer which forms the photoresist pattern.

12. The method as claimed in claim 11, wherein the substrate is one selected from the group consisting of a silicon substrate, a glass substrate, a metal oxide substrate, a ceramic substrate and a plastic substrate.

13. The method as claimed in claim 11, wherein the photocatalytic layer is one selected from the group consisting of a titanium dioxide ($TiO_2$) layer, a zinc oxide (ZnO) layer, a tin dioxide ($SnO_2$) layer, a strontium titanate ($SrTiO_3$) layer, a tungsten oxide ($WO_3$) layer, a boron oxide ($B_2O_3$) layer, and an iron oxide ($FeO_3$) layer.

14. The method as claimed in claim 11, wherein the photocatalytic layer is formed on the substrate using one method selected from the group consisting of a sol-gel method, a chemical vapor deposition method and a physical vapor deposition method.

* * * * *